United States Patent [19]

Otoma et al.

[11] Patent Number: 5,648,295

[45] Date of Patent: Jul. 15, 1997

[54] METHOD OF MAKING A SEMICONDUCTOR LASER DEVICE

[75] Inventors: Hiromi Otoma; Nobuaki Ueki; Hideki Fukunaga; Hideo Nakayama; Yasuji Seko; Mario Fuse, all of Kanagawa, Japan

[73] Assignee: Fuji Xerox Co., Ltd., Tokyo, Japan

[21] Appl. No.: 687,938

[22] Filed: Jul. 29, 1996

Related U.S. Application Data

[62] Division of Ser. No. 523,389, Sep. 5, 1995, Pat. No. 5,588,016.

[30] Foreign Application Priority Data

Sep. 6, 1994 [JP] Japan .................. 6-212650

[51] Int. Cl.$^6$ .................................. H01L 21/20
[52] U.S. Cl. .................. 437/129; 437/126; 437/133; 437/141; 372/46
[58] Field of Search .................. 437/129, 126, 437/133, 141; 372/46

[56] References Cited

U.S. PATENT DOCUMENTS

| 5,047,366 | 9/1991 | Murakami | 437/141 |
| 5,219,785 | 6/1993 | Welch et al. | 437/129 |
| 5,232,867 | 8/1993 | De Cremoux | 437/129 |
| 5,253,265 | 10/1993 | Soko et al. | |
| 5,256,596 | 10/1993 | Ackley et al. | 437/129 |
| 5,275,969 | 1/1994 | Takahashi | |
| 5,376,583 | 12/1994 | Northrup et al. | 437/129 |
| 5,460,984 | 10/1995 | Yoshida | 437/141 |
| 5,567,646 | 10/1996 | Heberern | 437/129 |

FOREIGN PATENT DOCUMENTS

| 4-219989 | 8/1992 | Japan |
| 6-53604 | 2/1994 | Japan |
| 6-53605 | 2/1994 | Japan |

OTHER PUBLICATIONS

Dallesasse, et al., "Impurity–induced layer disordering in $In_{0.5}(Al_xGa_{1-x})$ 0.5 P–InGaP quantum–well heterostructure: Visible–spectrum–buried heterostructure lasers," Jul. 15, 1989, J. Appl. Phys. vol. 66, pp. 482–487.

Meehan, et al., "Zn disordering of $Ga_{0.5}In_{0.5}P–(Al_xGa_{1-x})_{0.5}In_{0.5}P$ quantum well heterostructure grown by metalorganic chemical vapor deposition," Appl. Phys. Letter, vol. 54, May 22, 1989, pp. 2136–2138.

Primary Examiner—Charles L. Bowers, Jr.
Assistant Examiner—Ramamohan Rao Paladugu
Attorney, Agent, or Firm—Finnegan, Henderson, Farabow, Garrett & Dunner, L.L.P.

[57] ABSTRACT

A semiconductor laser device in which semiconductor layers of an n-type cladding layer, a quantum well active layer 106, a p-type cladding layer, and an intermediate layer are formed on an n-type GaAs substrate in successive order, and a mixed-crystal is formed in a region except the semiconductor layers of the contact layer and the lower part of the contact layer by diffusing Si into the structure from above the intermediate layer, characterized in that the contact layer and the intermediate layer are made of n-type or nonconductive semiconductor material, and a p-type low-resistance region, formed by diffusing Zn into the structure from above the contact layer, is profiled so as not to overlap with the mixed-crystal region formed by Si diffusion.

4 Claims, 8 Drawing Sheets

METHOD OF MAKING A SEMICONDUCTOR LASER DEVICE

This is a division of application Ser. No. 08/523,389, filed Sept. 5, 1995, now U.S. Pat. No. 5,588,016.

BACKGROUND OF THE INVENTION

The present invention relates to a visible buried semiconductor laser device manufactured by the mixed-crystal forming technique based on the impurity diffusion.

When impurity such as Zn is thermally diffused or ion planted into the superlattice, which consists of extremely thin semiconductor layers, several to several tens nm thick, of different compositions such as AlGaAs—GaAs, the superlattice is destroyed and transformed into a uniform mixed-crystal. This fact is known. When the mixed-crystal is formed, refractivity, forbidden band, and the like are varied. This nature can be used for confining light and carriers therein. The buried semiconductor laser device, manufactured by the mixed-crystal forming technique based on the impurity diffusion, has various advantages: low threshold current value, high efficiency, stable transverse mode, and easy integration. For this reason, AlGaAs series as a material for the near-infrared semiconductor laser is frequently used for the buried semiconductor laser device.

Appl. Phys. Lett. 54, p2136 (1989) describes the mixed-crystal forming technique based on the impurity diffusion in AlGaInP series as a material for the visible semiconductor laser device, in which the impurity is Zn. When Zn is diffused, a natural superlattice of AlGaInP as a material for the visible semiconductor laser device is transformed into a mixed-crystal, but mutual diffusion of Al and Ga is not remarkable. The natural superlattice follows. When AlGaInP is crystal grown by a MOCVD method, the group III atoms are regularly arrayed into the natural superlattice. This phenomenon is described in Appl. Phys. No. 9 of Volume 58, p1360 (1989). Where the natural superlattice is transformed into a mixed-crystal, the forbidden band width difference for confining carriers and the refractivity difference for confining light cannot be rendered satisfactorily large between a mixed-crystal region and a non-mixed-crystal region.

To efficiently confine carriers, it is necessary to greatly vary the forbidden band width and the refractivity between a mixed-crystal region and a non-mixed-crystal region, by causing Al and Ga to mutually diffuse.

Journal of Applied Physics, vol. 66, p482 (1989) describes a semiconductor laser device manufactured by the mixed-crystal forming technique based on the Si diffusion in AlGaInP series. A Si-diffusion basis, buried visible semiconductor laser device is simpler in manufacturing process than the ridge-stripe type visible semiconductor laser device.

The laser described in the paper has poor laser characteristics since during the manufacturing process particularly during the Si diffusing process, many dislocations and defects are caused. Our observation by a transmission electron microscopy showed that these dislocations and defects are concentrated mainly in the surface region of the second conductivity type GaInP intermediate layer in the Si diffused region.

The influence of the dislocations and defects on the semiconductor laser device will be described. FIG. 9 shows an AlGaInP buried laser, which is manufactured by the mixed-crystal forming technique based on the Si impurity diffusion disclosed in Published Unexamined Japanese Patent Application No. Hei. 6-53604. In the figure, reference numeral 401 designates an n-type side electrode; 402, an n-type GaAs substrate; 403, an n-type GaInP buffer layer; 404, an n-type AlInP cladding layer; 405, a GaInP active layer; 406, a p-type AlInP cladding layer; 407, a p-type GaInP intermediate layer; 408, an Si diffusion source film; 409, an $SiO_2$ diffusion protective film/current block layer; 410, a p-type side electrode; 411, a $p^+$ type GaAs contact layer; 412, an Si diffusion region; and 413, a surface region where many dislocations and defects that are caused by the Si diffusion are present.

In this type of the AlGaInP buried laser by the Si diffusion, ideally, the current injected from the p-type side electrode 410 is squeezed by the pn junction formed along the boundary between the p-type GaInP intermediate layer 407 and the Si diffusion region 412. As a result, the current is efficiently injected into only the active layer.

Actually, the current leaks through the boundaries 414 and 415 each between the surface region 413 where many dislocations and defects are present and the p-type GaInP intermediate layer 407. In this situation, the current is inefficiently injected into the active layer. The result is high threshold current value, low efficiency, and poor temperature characteristic.

SUMMARY OF THE INVENTION

Accordingly, an object of the present invention is to improve an AlGaInP buried laser, manufactured by the mixed-crystal forming technique based on the Si impurity diffusion, so as to cause no leak current, to reduce the threshold current value, and to increase the efficiency.

To achieve the above object, there is provided a semiconductor laser device, comprising:

a) a substrate;

b) a first cladding layer made of semiconductor material of a first conductivity type and layered on the substrate;

c) a quantum well active layer made of semiconductor material and layered on the first cladding layer;

d) a second cladding layer layered on the quantum well active layer, the second cladding layer being made of semiconductor material of a second conductivity type that is opposite to the first conductivity type;

e) an intermediate layer made of semiconductor material of the first conductivity type or nonconductive type semiconductor, the intermediate layer being layered on the second cladding layer;

f) a contact layer made of semiconductor material of the first conductivity type or nonconductive type semiconductor, the contact layer being layered on a part of the intermediate layer;

g) a mixed-crystal region of the first conductivity type being formed at a location deviated sideways from a region under the contact layer, while ranging from the intermediate layer to the quantum well active layer; and h) a low resistance region of the second conductivity type extended over a range from the contact layerr through the intermediate layer, to part of the second cladding layer, the low resistance region being isolated from the mixed-crystal region by the intermediate layer.

The layers constituting the semiconductor laser device will be described below.

Intermediate Layer

The intermediate layer is a mixed-crystal layer or a superlattice layer between a cladding layer and a contact layer, and also called a buffer layer. In the vertical structure of the semiconductor laser device, the intermediate layer functions as follows. When the intermediate layer is inserted between the cladding layer and the contact layer, the band discontinuity quantity between the cladding layer and the contact layer is reduced, a depletion layer present in the interface is reduced in thickness, and as a consequence a series resistance of the semiconductor laser device is reduced. In the present invention, the conductivity type (n or p type) of the intermediate layer is nonconductive or opposite to the conductivity type of the cladding layer that is in contact with the underside of the intermediate layer. The intermediate layer is a GaInP or AlGaInP mixed-crystal layer or an AlInP/GaInP superlattice layer.

Contact Layer

The contact layer is a layer on which an electrode is to be formed. A semiconductor of small band gap is used for the contact layer, in order to reduce a contact resistance created in the interface between the electrode metal and the semiconductor. The contact layer is made of GaAs.

Cladding Layer

The cladding layer confines carriers within the active layer, thereby to make it easy to recombine carriers, and confines light that is caused in the active layer by the recombination of carriers and stimulated emission, in the vertical direction (perpendicular to the substrate). A structure of the semiconductor laser device, which consists of a cladding layer, an active layer, and a cladding layer, is usually called a double heterostructure. This structure is a basic structure for causing a laser oscillation. AlInP and AlGaInP are typical examples of the double heterostructure.

Quantum Well Active Layer:

In this layer, light is emitted by the recombination of carriers or stimulated emission, and resonates in the layer. GaInP is an example of the quantum well active layer.

Formation of the low resistance region can be controlled by properly selecting the diffusion conditions of the first impurity and the second impurity, the size of the opening, a positional relationship between the opening and the first impurity diffusion source, and the thickness of the contact layer and the intermediate layer. In the impurity diffusion process, the diffusion region depends on the diffusion length determined by the diffusion condition such as the diffusion temperature and time, the position of the first impurity layer as a diffusion source and the opening through which the second impurity is supplied. The diffusion almost isotopically progresses in the lateral direction and in the vertical direction. Each of the diffusion lengths of the first impurity and the second impurity can be controlled independently by adjusting the diffusion conditions, because the diffusion temperature of the first impurity is not equal to the diffusion temperature of the second impurity.

A desired low resistance region may be formed if the relationships among the size of the opening of the diffusion protective layer, and the thickness of the contact layer and the intermediate layer are selected in the following way on the basis of this fact (FIG. 1B).

The diffusion conditions of the first and the second impurity, a specific size of the opening or contact hole, and the positional relationship between the contact hole and the first impurity diffusion source are selected so as to satisfy the following inequality $$l_1 + l_2 < l$$

where $l_1$: length of the diffusion of the first impurity in the direction parallel to the surface of the intermediate layer $l_2$: length of the diffusion of the second impurity in the direction parallel to the surface of the intermediate layer $l$: distance between the side wall of the contact hole and the end of the first impurity diffusion source.

The diffusion length $c$ of the second impurity in the direction vertical to the substrate surface is uniquely determined as described above. The total thickness $d$ of the contact layer and the intermediate layer, or the distance from the uppermost surface of the semiconductor layer into which the second impurity is diffused to the second cladding layer, must be selected so as to satisfy the following inequality $$d < c.$$

In a buried laser such as AlGaInP laser manufactured by the mixed-crystal forming technique based on the Si impurity diffusion, which incorporates the present invention, a current path avoids the surface region of the Si diffusion region in the p-type GaInP intermediate layer where the dislocations and defects are concentrically present. Therefore, there is successfully eliminated the leak current flowing through the dislocations and defects. Low threshold current value, high efficiency, good temperature characteristic, an the like are realized in the resultant visible semiconductor laser device.

DETAILED DESCRIPTION OF THE PREFERRED EMBODIMENTS (First Embodiment)

Figure 1A:
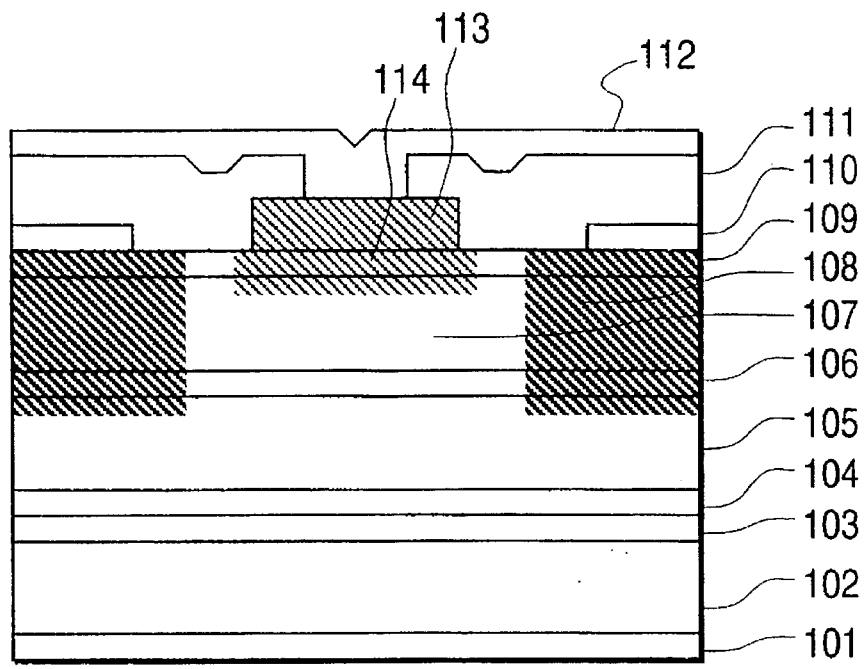
FIG. 1A is a cross sectional view showing a buried semiconductor laser device according to a first embodiment of the present invention.

FIG. 1A is a cross sectional view showing a semiconductor laser device according to an embodiment of the present invention. The semiconductor laser device described in the present embodiment is a semiconductor laser device of the edge-emitter type in which the resonator extends in the direction (vertical to the paper surface) parallel to the plane of a semiconductor substrate.

In the figure, reference numeral 101 designates an n-type side electrode 101; 102, an n-type GaAs substrate; 103, an n-type GaAs buffer layer; 104, an n-type GaInP buffer layer; 105, an n-type $(Al_xGa_{1-x})_{0.5}In_{0.5}P$ (0.5<X≦1) cladding layer; 106, a GaInP active layer; 107, a p-type $(Al_xGa_{1-x})_{0.5}In_{0.5}P$ (0.5<X≦1) cladding layer; 108, an Si diffusion region; 109, an n-type or nonconductive $(Al_xGa_{1-x})_{0.5}In_{0.5}P$ (0≦X<0.5) intermediate layer; 110, an Si diffusion source film; 111, an $SiO_2$ current block layer; 112, a p-type side electrode; 113, an n-type or nonconductive GaAs contact layer; and 114, a Zn diffusion region.

It is noted that in the semiconductor laser device, 1) the intermediate layer 109 and the n-type or nonconductive GaAs contact layer 113 are of the n-type or nonconductive type, and 2) the Zn diffusion region 114 is profiled so as not to overlap with the Si diffusion region 108 (FIG. 1A). Current injected from the p-type side electrode 112 flows avoiding a surface region of the intermediate layer 109 where dislocations and lattice defects, caused by the Si impurity diffusion, are concentrically present. Therefore, there is eliminated the current leaking through those dislocations and defects.

Figure 2A:
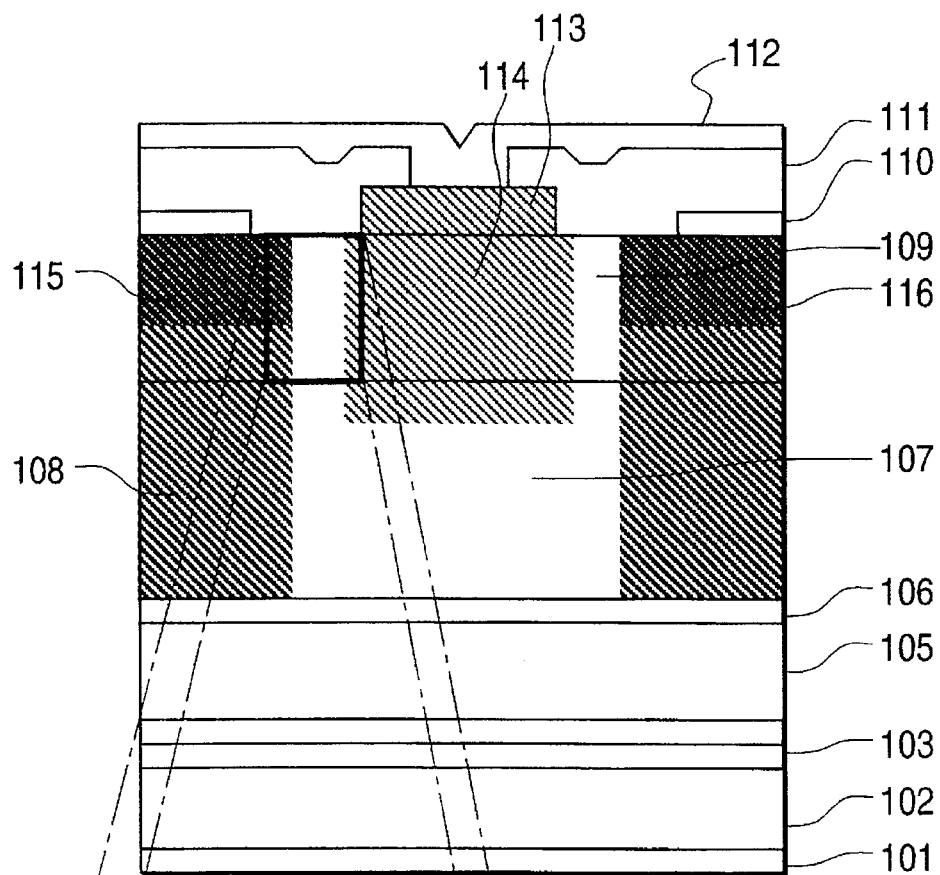
FIGS. 2A and 2B are cross sectional views for explaining a leak current control mechanism in the intermediate layer in the first embodiment.
Figure 2B:
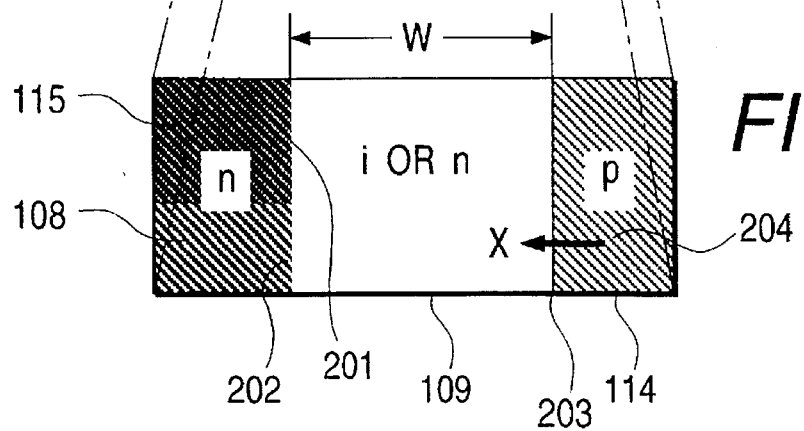

A mechanism that current injected from the p-type side electrode 112 flows avoiding the surface region of the intermediate layer 109 where may dislocations and defects are caused by the Si impurity diffusion, will be described in detail with reference to FIGS. 2A and 2B. FIGS. 2A and 2B are cross sectional views emphatically showing the intermediate layer 109 in the semiconductor laser device of FIG. 1A. Numerals 115 and 116 designate the surface regions of the intermediate layer 109 containing many dislocations and lattice defects caused by the Si impurity diffusion. FIG. 2B shows an enlarged, sectional view showing a portion 117 in the structure of FIG. 2A. Numeral 202 indicates a boundary between the intermediate layer 109 and the Si diffusion region 108 where a small number of dislocations and defects are caused by the Si impurity diffusion. Numeral 201 indicates a boundary between the intermediate layer 109 and the surface region 115 containing many dislocations and defects caused by the Si impurity diffusion. When the intermediate layer 109 is of the p type, and a pn junction is formed in the boundary 201, current leaks through the dislocations and defects as in the conventional art.

In the present invention, 1) the intermediate layer 109 is of the negative conductivity type, and 2) an electron depletion region by the pn junction is formed in the boundary 203 between the Zn diffusion region 114 and the intermediate layer 109 where no defect is present. By this structure, no current leaks through the dislocations and the defects. If an undoped high resistance layer is used for the intermediate layer 109, this portion 117 forms a pin junction. Further, a self-align process to be given later allows the intermediate layer 109 as the i layer to have a large width W of approximately 1 μm. Therefore, the resistance of the pin junction is satisfactorily large (proportional to the square of the width W). The high resistance blocks the movement (indicated by numeral 204) of carriers from the Zn diffusion region 114 to the boundary 202.

Figure 1B:
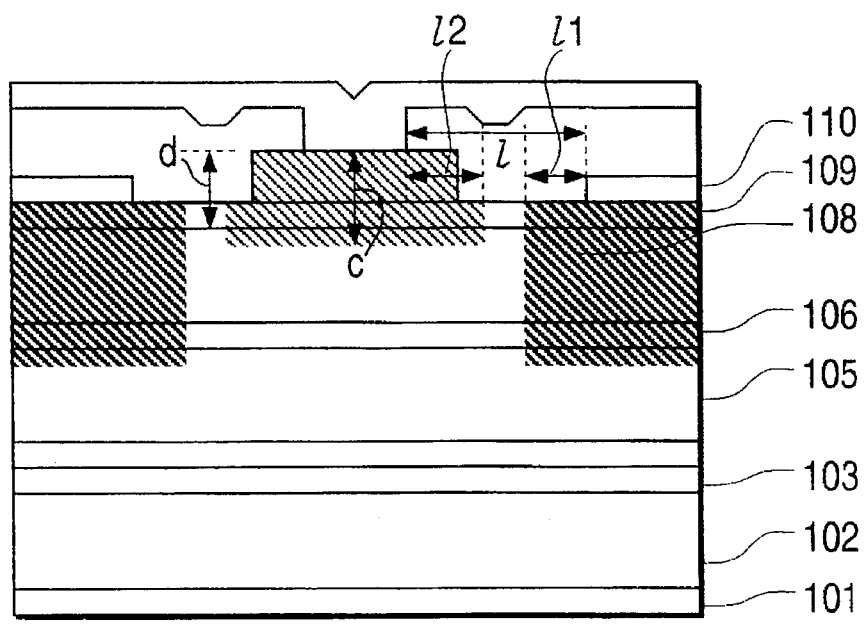
FIG. 1B is a cross sectional view showing positional relationships among the regions and layers in the structure of the semiconductor laser device of FIG. 1A.

Incidentally, $W=1-(l_1+l_2)$ (FIG. 1B).

A method of manufacturing the semiconductor laser device thus structured will be described with reference to FIGS. 3 to 7.

To start, the following semiconductor layers are formed on an n-type GaAs substrate 102 in successive order by MOCVD (metal organic chemical vapor deposition) or GSMBE (gas source molecular beam epitaxy): an n-type GaAs buffer layer 103 of 0.2 μm, made of Si doped n-type GaAs, a buffer layer 104 of 0.2 μm thick, made of Si doped n-type $Ga_{0.5}In_{0.5}P$, a cladding layer 105 of 1 μm thick, made of Si doped n-type $(Al_xGa_{1-x})_{0.5}In_{0.5}P$ (0.5 <X)≦1), an undoped active layer 106, a cladding layer 107 of 0.5 μm thick, made of Zn doped p-type $(Al_xGa_{1-x})_{0.5}In_{0.5}P$ (0.5<X) ≦1), an intermediate layer 109 of 0.1 μm thick, made of n-type or nonconductive $(Al_xGa_{1-x})_{0.5}In_{0.5}P$ (0≦X<0.5), and a contact layer 114 of 0.2 μm thick, made of undoped GaAs. In the structure of the active layer, two of three $Ga_{0.5}In_{0.5}P$ well layers each of 10 nm thick are separated by two $(Al_{0.5}Ga_{0.5})_{0.5}In_{0.5}P$ barrier layers, and these separated ones are each sandwiched by $(Al_{0.5}Ga_{0.5})_{0.5}In_{0.5}P$ wave guiding layers.

Figure 3A:
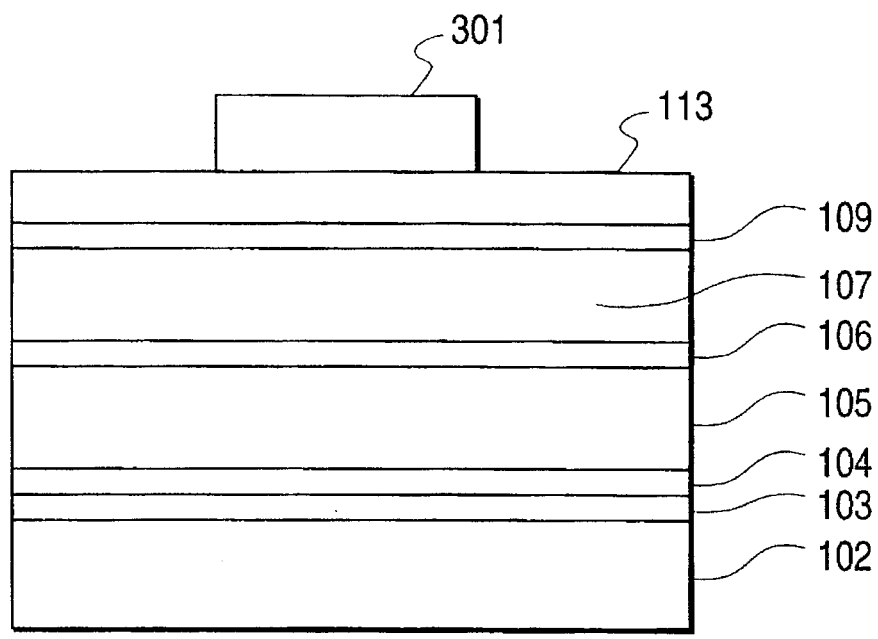
FIGS. 3A and 3B are cross sectional views showing procedural steps of manufacturing the buried semiconductor laser device according to the first embodiment of the present invention.
Figure 3B:
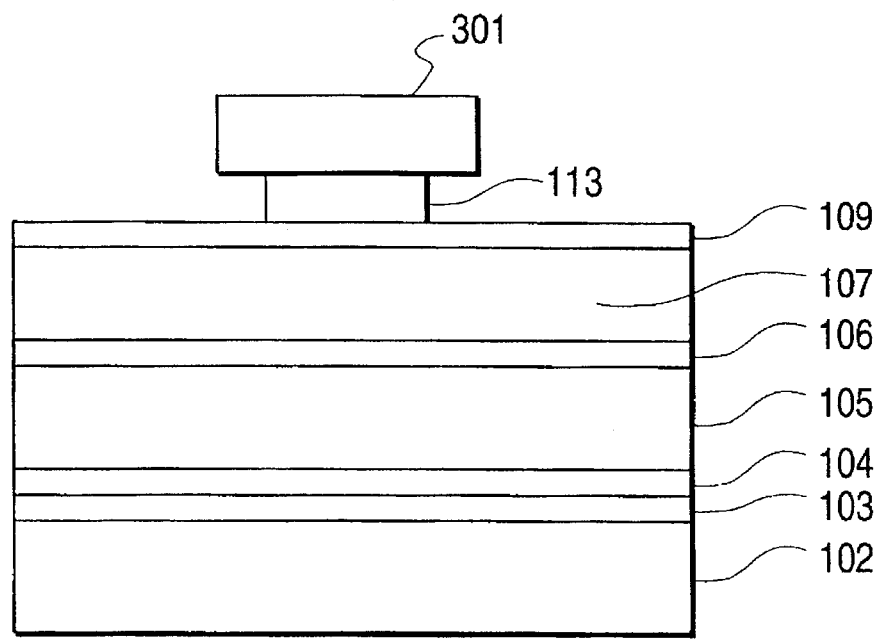

A stripe-like photoresist 301 of 7 μm wide is formed on the resultant structure by photolithographic technique (FIG. 3A). Using this photoresist 301 as a mask, the GaAs contact layer 113 is selectively etched into a stripe of 3 μm wide by an etching solution as a mixture of $NH_4OH$, $H_2O_2$ and $H_2O$ at the ratio of $NH_4OH:H_2O_2:H_2O=1:2:100$, for the $(Al_xGa_{1-x})_{0.5}In_{0.5}P$ intermediate layer 109. The etching solution used here little etches the $(Al_xGa_{1-x})_{0.5}In_{0.5}P$ intermediate layer 109. It etches only the side of the GaAs contact layer 113. In other words, the width of the GaAs contact layer 113 can be controlled.

Figure 4A:
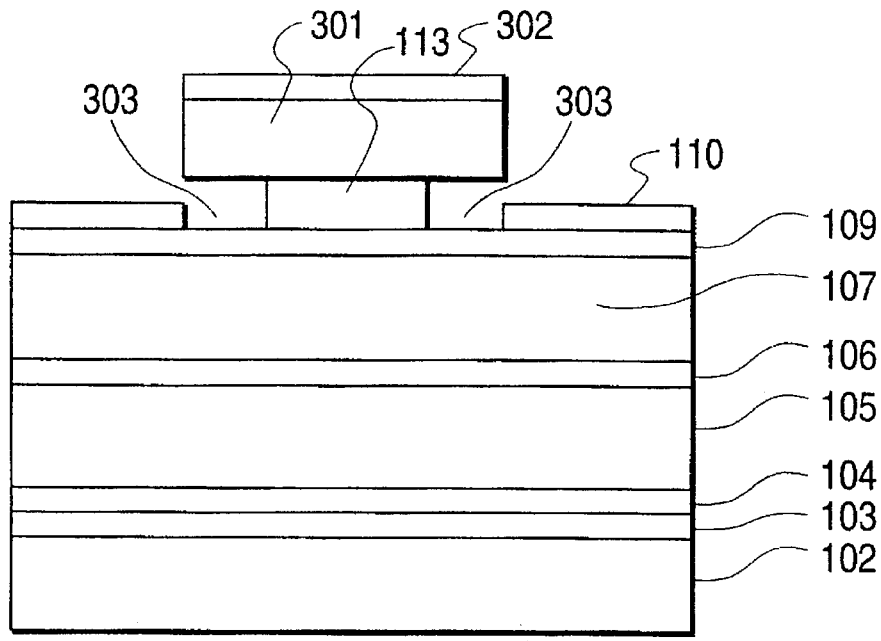
FIGS. 4A and 4B are cross sectional views showing procedural steps of manufacturing the buried semiconductor laser device which follow the procedural steps of FIG. 3.

Si diffusion source films 110 and 302 as impurity diffusion sources are deposited, for example, approximately 5 nm on the entire surface of the structure in vacuum of $1.3 \times 10^{-2}$ Pa or less by an electron beam heating/depositing apparatus, while the photoresist 301 is left as it is (FIG. 4A). In the deposition process, Si is not deposited on the upper surface of the GaAs contact layer 113 under the photoresist 301, and a portion 303 of the upper surface of the intermediate layer 109 which is located under the photoresist 301 and exposed as the result of the side etching of the GaAs contact layer 113 since those portions are masked with the photo photoresist 301.

Figure 4B:
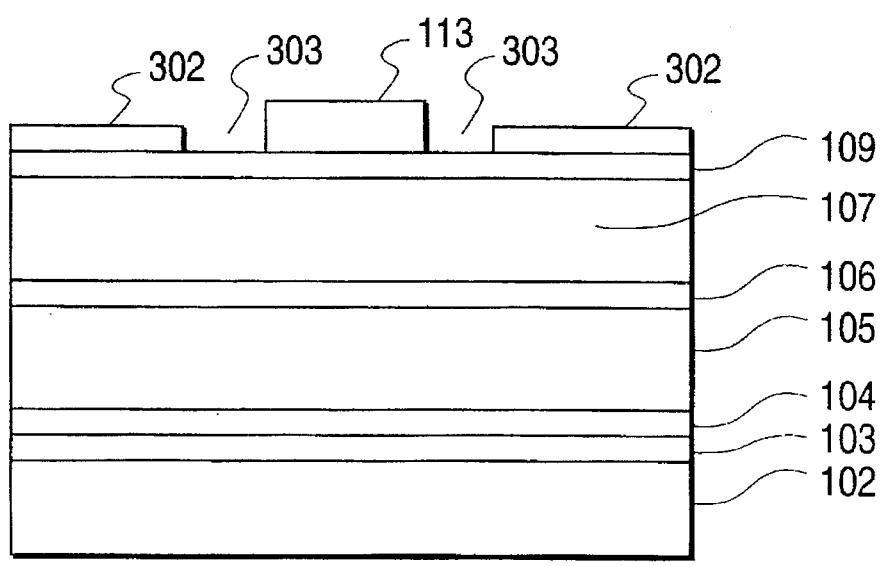

Thereafter, by removing the photoresist 301, the Si film 302 above the GaAs contact layer 113 is removed by a lift-off method (FIG. 4B).

Figure 5A:
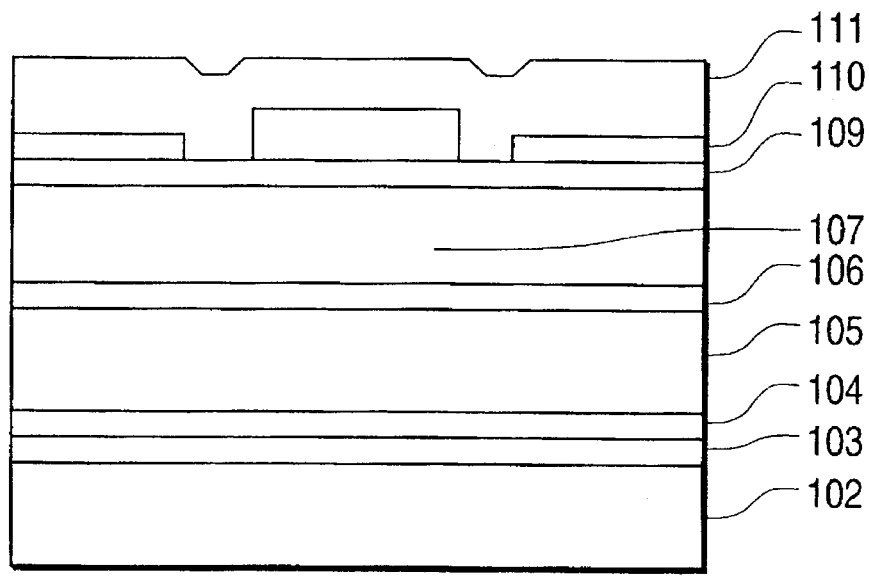
FIGS. 5A and 5B are cross sectional views showing procedural steps of manufacturing the buried semiconductor laser device, which follow the procedural steps of FIG. 4.

Then, an $SiO_2$ film 111 of 50 nm thick as a surface protective film is formed on the entire upper surface of the structure (FIG. 5A).

Figure 5B:
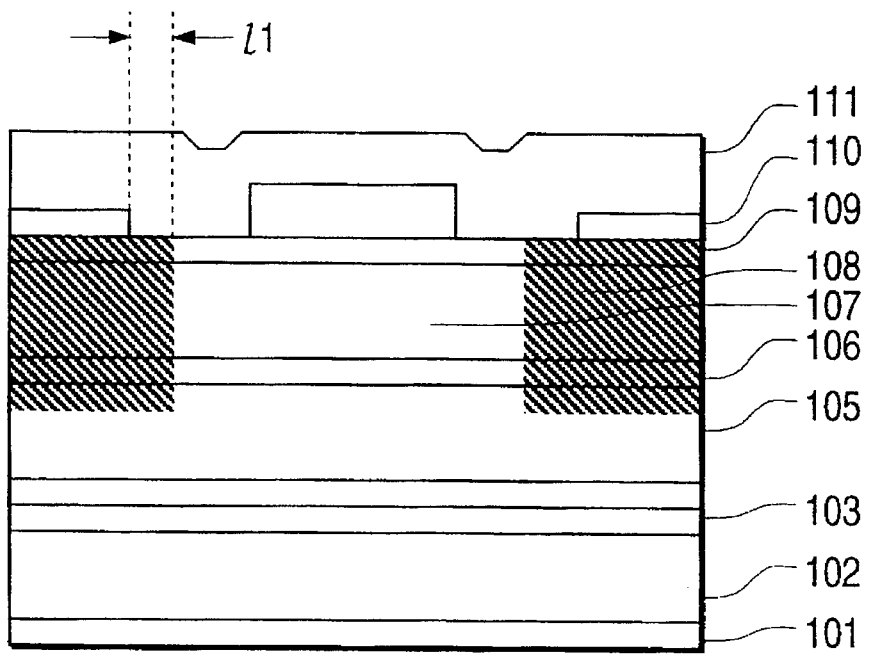

The structure, together with phosphorus, is put into a quartz tube, and sealed. Then, it is placed at 850° C. for 3 hours in an electric furnace. Through the heat treatment Si is diffused till it reaches the n-type $(Al_xGa_{1-x})_{0.5}In_{0.5}P$ (0.5<X≦1) cladding layer 105, whereby an Si diffusion region 108 is formed (FIG. 5B). The Si diffusion region 108 is of the n type, and forms a mixed-crystal in the intermediate layer 109 and the p-type $(Al_xGa_{1-x})_{0.5}In_{0.5}P$ (0.5<X≦1) cladding layer 107, and in the p-type $(Al_xGa_{1-x})_{0.5}In_{0.5}P$ (0.5<X≦1) cladding layer 107, the GaInP active layer 106, and the n-type $(Al_xGa_{1-x})_{0.5}In_{0.5}P$ (0.5<X≦1) cladding layer 105. As the result of the lateral Si diffusion, the Si diffusion region is extended more inward than the Si vapor deposition end by $l_1$. In the process of the present embodiment, $l_1$ is approximately 1 μm.

Figure 6A:
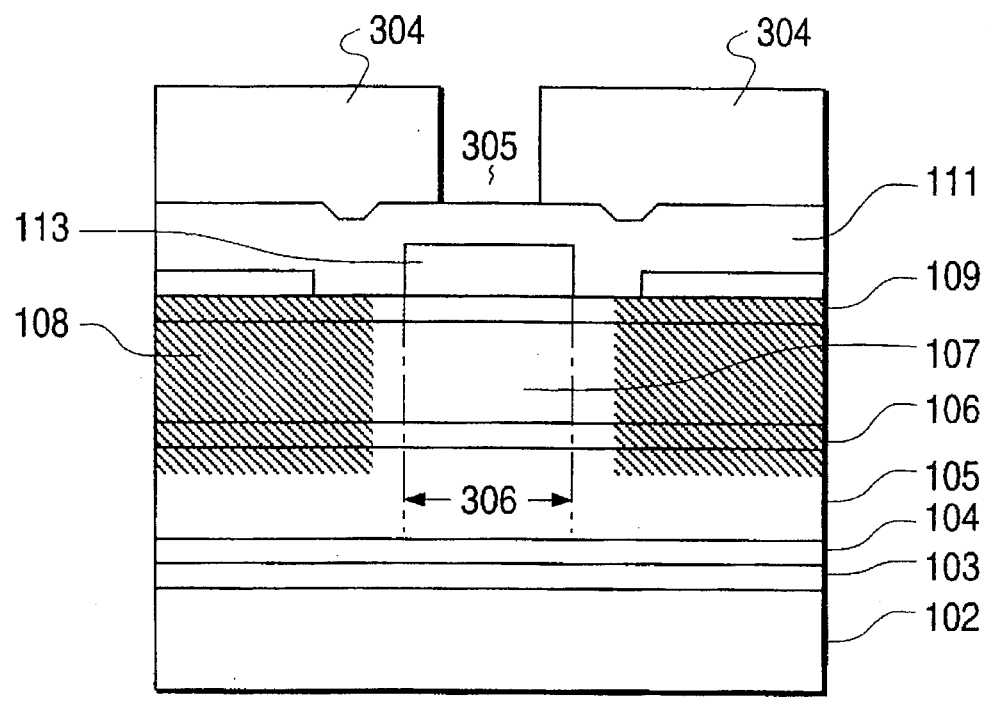
FIGS. 6A and 6B are cross sectional views showing procedural steps of manufacturing the buried semiconductor laser device, which follow the procedural steps of FIG. 5.
Figure 6B:
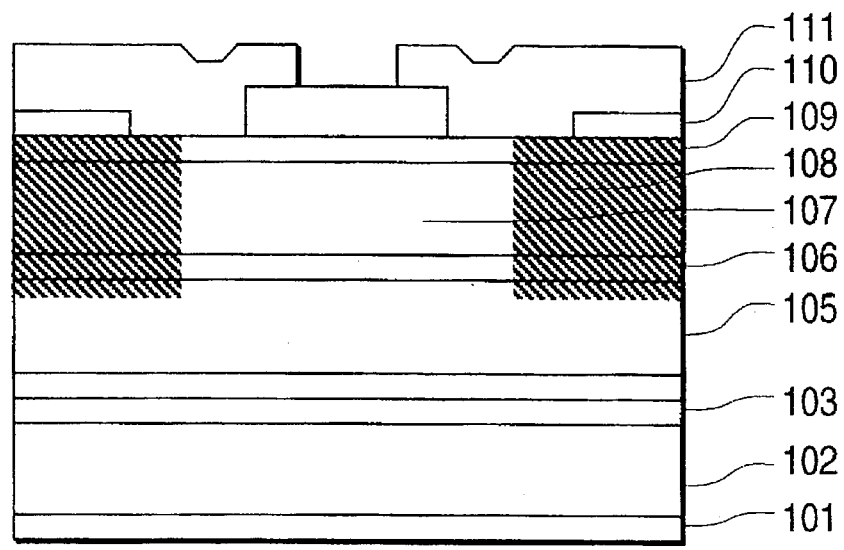

Subsequently, the structure is taken out of the quartz tube, and the SiO$_2$ layer 111 is coated with photoresist 304. A window 305 is formed by normal photolithographic technique (FIG. 6A). The width of the window 305 is narrower than the width 306 of the GaAs contact layer 113. The SiO$_2$ layer 111, located right under the window 305, is removed with buffered fluoric acid, and the photoresist 304 is removed with organic cleaning fluid (FIG. 6B).

Figure 7A:
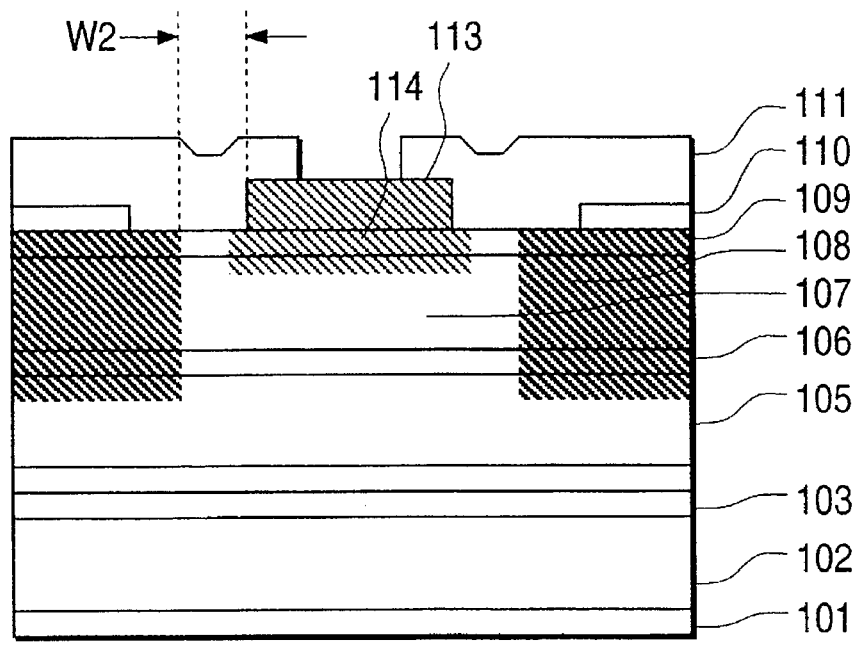
FIG. 7 is a cross sectional view showing a procedural step of manufacturing the buried semiconductor laser device, which follow the procedural steps of FIG. 6.

The structure, together with zinc, phosphorus, and arsenic, is put into a quartz tube and sealed. Then, it is placed at 550° C. for 20 minutes in an electric furnace. Through the heat treatment, with the SiO$_2$ film 111 as a mask, Zn is selectively diffused into the n-type or undoped GaAs contact layer 113, to thereby form an Zn diffusion region 114 (FIG. 7A). The temperature and time of the heat treatment may be properly selected if the diffusion front of the Zn diffusion region 114 reaches the p-type Al$_{0.5}$In$_{0.5}$P cladding layer 107. Since the Zn diffusion is isotropic, the lateral diffusion distance is substantially equal to the vertical diffusion distance (approximately 0.1 µm). Since the width W2 is large, 1 µm, there is less chance that the Zn diffusion region 114 overlaps with the Si diffusion region 108.

Figure 7B:
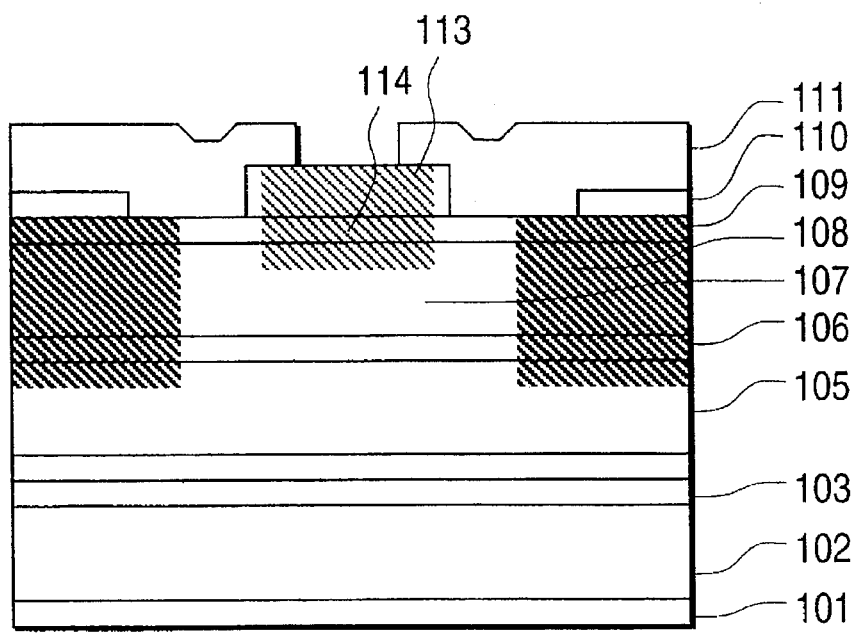

It is also possible to diffuse Zn into the region as illustrated in FIG. 7B, because the Zn diffusion region should not overlap the Si diffusion region.

Thereafter, a p-type side electrode 112 and an n-type side electrode 101 are respectively vapor deposited over the top and bottom sides of the structure, to complete a semiconductor laser device as shown in FIG. 1A.

(Second Embodiment)

In a second embodiment of a semiconductor laser device according to the present invention, the n-type or nonconductive intermediate layer 109 in FIG. 1A is substituted by a superlattice layer consisting of n-type (first conductivity type) or nonconductive GaInP thin film layers and AlInP thin film layers that are alternately layered. Provision of the thus structured superlattice layer forms a mini-band in the intermediate layer. By adjusting the thickness of the GaInP thin film layer and the thickness of the AlInP thin film layer, the effective band gap in the intermediate layer is set to be wider than the band gap of the active layer, but to be narrower than the band gap of the cladding layer of the p type (second conductivity type). By so adjusting, the threshold voltage of the pn junction or the pin junction in the region shown in FIG. 2B is increased above the threshold voltage of the active layer. The leak current restricting effect is improved. The band discontinuity quantity of the contact layer and the p-type (second conductivity type) cladding layer is reduced, thereby reducing the series resistance.

(Third Embodiment)

In the first and second embodiments, the present invention is applied to the edge-emitter type laser diode in which the resonator extends in the direction parallel to the plane of a semiconductor substrate. The present invention may also be applied to a so-called vertical resonator type (Vertical Cavity Surface Emitting Laser Diode (VCSEL)) device in which the resonator extends in the direction vertical to the plane of a semiconductor substrate.

Figure 8:
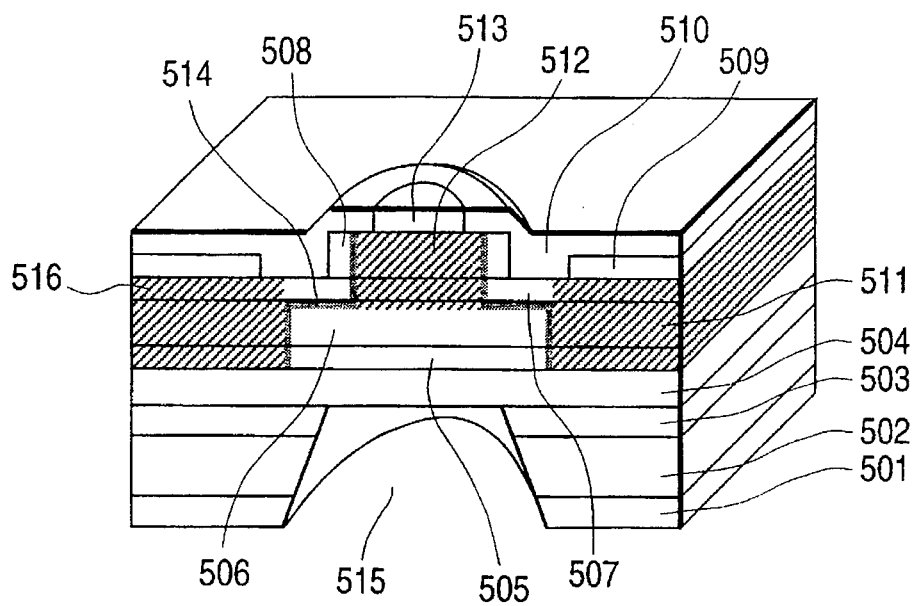
FIG. 8 is a sectional view in perspective of a vertical resonance type semiconductor laser device according to a third embodiment of the present invention.
Figure 9:
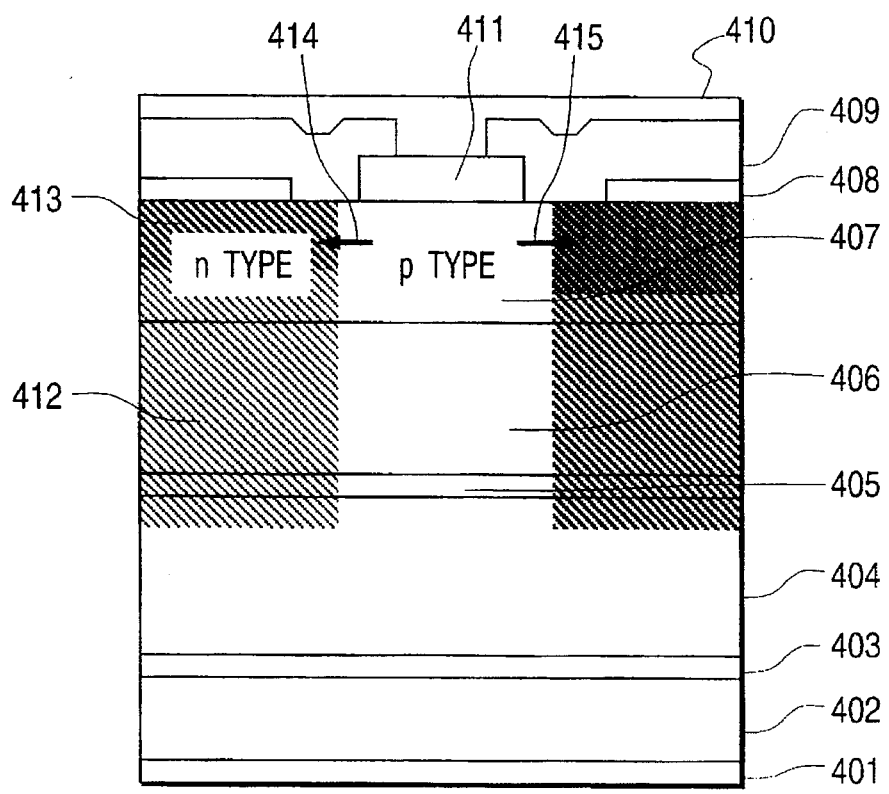
FIG. 9 is a cross sectional view useful in explaining a leak current generation mechanism in a conventional buried semiconductor laser device.

FIG. 8 is a sectional view in perspective of a vertical resonance type semiconductor laser device according to a third embodiment of the present invention. In the figure, reference numeral 501 designates an n-type side electrode; 502, an n-type GaAs substrate; 503, a buffer layer; 504, an n-type semiconductor multi-layer reflection film; 505, a 3-layer-structure layer consisting of a p-type cladding layer, an active layer, and an n-type cladding layer that are layered in the order from top to bottom; 506, a p-type semiconductor multi-layer reflection film; 507, an undoped or n-type intermediate layer; 508, an undoped or n-type contact layer; 509, an Si film; 510, an SiO$_2$ diffusion protective film/current block layer; 511, an Si diffusion region; 512, a Zn diffusion region; and 513, a p-type side electrode.

Current injected from the p-type side electrode 513 is blocked by a bold-line portion 514. Therefore, no current leaks through a defect layer portion 516 caused by the Si diffusion. The semiconductor laser device thus constructed can effectively squeeze current, to thereby emit a laser beam through a window 515.

In the present invention, an AlGaInP buried laser, manufactured by the mixed-crystal forming technique based on the Si impurity diffusion, can block the leak current that would flow through dislocations and defects caused in an upper region of the Si diffusion region in the intermediate layer. A Si-diffusion basis, buried visible semiconductor laser device of the present invention, which is simpler in manufacturing process than the ridge-stripe type visible semiconductor laser device, can realize low threshold current value, high efficiency, and high temperature characteristic. Thus, the present invention succeeds in providing a visible semiconductor laser device of low cost and less power dissipation.

In the above embodiments the semiconductor laser device is AlGaInP buried laser, but it is possible to apply to an AlGaAs buried laser, either. In this case, the layer structure is the same as shown in FIG. 1A, and the cladding layers 105, 107 consisted of AlGaInP in the first embodiment is substituted to AlGaAs layer, and the intermediate layer 109 consisted of AlGaInP or the buffer layer 104 and the active layer 106 consisted of GaInP in the first embodiment are changed to GaAs or AlGaAs layers. The conductivity type of each layer are the same as the first embodiment. The composition ratio of each atoms of AlGaAs layer are selected as the ratio of the conventional AlGaAs buried lasers.

What is claimed is:

1. A method for manufacturing a semiconductor laser device, comprising the steps of:

a) forming a first cladding layer made of semiconductor of a first conductivity type on a substrate;

b) forming a quantum well active layer made of semiconductor on said first cladding layer;

c) forming a second cladding layer layered on said quantum well active layer, said second cladding layer being made of semiconductor material of a second conductivity type that is opposite to said first conductivity type;

d) forming an intermediate layer on said second cladding layer, said intermediate layer being made of semiconductor material of said first conductivity type or nonconductive type semiconductor;

e) forming a contact layer on a part of said intermediate layer, said contact layer being made of semiconductor material of said first conductivity type or nonconductive type semiconductor;

f) forming a first impurity layer at a location deviated sideways from said contact layer, said first impurity layer being made of a first impurity for forming a mixed crystal of said second conductivity type by diffusing said first impurity into said second cladding layer;

g) forming a mixed-crystal by diffusing the first impurity into the structure up to said quantum well active layer after said first impurity layer is formed; and h) forming a low resistance region of a second conductivity type by diffusing a second impurity, said low resistance region being extended over a range from said contact layer, through said intermediate layer, to part of said second cladding layer, and being isolated from said mixed-crystal region by said intermediate layer.

2. The method of manufacturing a semiconductor laser device of claim 1, further comprising:

a step of forming a diffusion/protective layer with an opening layered on said contact layer, and in said low resistance region forming step, said second impurity being supplied through said opening, from above said diffusion/protective layer.

3. The method of manufacturing a semiconductor laser device of claim 2, wherein the size of said opening of said diffusion/protective layer, and the thickness of said contact layer and said intermediate layer are selected such that the diffusion of said second impurity, which is supplied through said opening of said diffusion/protective layer, reaches said second cladding layer through said contact layer and said intermediate layer, and terminates before reaching said mixed crystal region made of said first impurity.

4. The method of manufacturing a semiconductor laser device of claim 2, wherein the size of said opening of said diffusion/protective layer, and the thickness of said contact layer, said intermediate layer and the impurities diffusion condition determining diffusion length of $l_1$ and $l_2$ are selected so as to satisfy the following inequalities:

$$l_1 + l_2 < l$$

$$d < c$$

where

- $l_1$: length of the diffusion of said first impurity in a direction parallel to the surface of said intermediate layer, as measured from the end of said impurity layer closer to said contact layer
- $l_2$: length of the diffusion of said second impurity in a direction parallel to the surface of said intermediate layer, as measured from the side wall of said opening of said diffusion/protective layer
- $l$: distance between a side wall of said opening of said diffusion/protective layer and the end of said impurity layer closer to said contact layer
- $c$: length of the diffusion of the second impurity in a direction vertical to the surface of said intermediate layer, as measured from the surface of said contact layer
- $d$: total thickness of said contact layer and said intermediate layer.

* * * * *

UNITED STATES PATENT AND TRADEMARK OFFICE
CERTIFICATE OF CORRECTION

PATENT NO. : 5,648,295
DATED : July 15, 1997
INVENTOR(S) : Hiromi OTOMA et al.

It is certified that error appears in the above-indentified patent and that said Letters Patent is hereby corrected as shown below:

In Claim 3, Col. 9, line 20, "mixed crystal" should read --mixed-crystal--.

In Claim 4, Col. 9, line 25, "$1_2$" should read --$1_2$--.

Signed and Sealed this

Second Day of December, 1997

BRUCE LEHMAN

Attest:

Attesting Officer

Commissioner of Patents and Trademarks